United States Patent
Lin et al.

(10) Patent No.: US 10,297,548 B2
(45) Date of Patent: *May 21, 2019

(54) INTERCONNECTION STRUCTURE, FABRICATING METHOD THEREOF, AND SEMICONDUCTOR DEVICE USING THE SAME

(71) Applicant: TAIWAN SEMICONDUCTOR MANUFACTURING CO., LTD., Hsinchu (TW)

(72) Inventors: Yu-Hung Lin, Taichung (TW); Chi-Wen Liu, Hsinchu (TW); Horng-Huei Tseng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/382,492

(22) Filed: Dec. 16, 2016

(65) Prior Publication Data
US 2017/0098613 A1    Apr. 6, 2017

Related U.S. Application Data

(63) Continuation of application No. 14/993,024, filed on Jan. 11, 2016, now Pat. No. 9,576,908.
(Continued)

(51) Int. Cl.
*H01L 23/48*    (2006.01)
*H01L 23/52*    (2006.01)
(Continued)

(52) U.S. Cl.
CPC .. *H01L 23/53209* (2013.01); *H01L 21/28518* (2013.01); *H01L 21/3065* (2013.01); *H01L 21/76802* (2013.01); *H01L 21/76805* (2013.01); *H01L 21/76814* (2013.01); *H01L 21/76843* (2013.01); *H01L 21/76846* (2013.01); *H01L 21/76855* (2013.01); *H01L 21/76877* (2013.01); *H01L 21/76886* (2013.01); *H01L 21/76889* (2013.01); *H01L 21/76895* (2013.01);
(Continued)

(58) Field of Classification Search
USPC ......................................................... 257/751
See application file for complete search history.

(56) References Cited

U.S. PATENT DOCUMENTS 5,394,012 A    2/1995   Kimura
5,824,586 A    10/1998  Wollesen et al.
(Continued)

FOREIGN PATENT DOCUMENTS

JP    H09213801 A    8/1997
JP    2001223178 A   8/2001
TW    201526088 A    7/2015

*Primary Examiner* — Niki H Nguyen
(74) *Attorney, Agent, or Firm* — Slater Matsil, LLP

(57) ABSTRACT

A semiconductor device includes a semiconductor substrate, an epitaxy structure present in the semiconductor substrate, and a silicide present on a textured surface of the epitaxy structure. A plurality of sputter ions are present between the silicide and the epitaxy structure. Since the surface of the epitaxy structure is textured, the contact area provided by the silicide is increased accordingly, thus the resistance of an interconnection structure in the semiconductor device is reduced.

20 Claims, 16 Drawing Sheets

Related U.S. Application Data

(60) Provisional application No. 62/216,902, filed on Sep. 10, 2015.

(51) Int. Cl.

| | | |
|---|---|---|
| *H01L 29/40* | (2006.01) |
| *H01L 23/532* | (2006.01) |
| *H01L 23/535* | (2006.01) |
| *H01L 21/768* | (2006.01) |
| *H01L 21/3065* | (2006.01) |
| *H01L 23/528* | (2006.01) |
| *H01L 21/285* | (2006.01) |
| *H01L 23/485* | (2006.01) |
| *H01L 29/417* | (2006.01) |

(52) U.S. Cl.
CPC ...... *H01L 21/76897* (2013.01); *H01L 23/485* (2013.01); *H01L 23/528* (2013.01); *H01L 23/535* (2013.01); *H01L 23/53266* (2013.01); *H01L 29/41791* (2013.01)

(56) References Cited

U.S. PATENT DOCUMENTS

| | | | |
|---|---|---|---|
| 6,096,629 A | 8/2000 | Tsai et al. | |
| 6,124,212 A | 9/2000 | Fan et al. | |
| 6,245,672 B1* | 6/2001 | Hong | H01L 21/76843 |
| | | | 257/E21.584 |
| 6,251,777 B1* | 6/2001 | Jeng | H01L 21/28052 |
| | | | 257/E21.165 |
| 6,558,739 B1 | 5/2003 | Liu et al. | |
| 9,230,795 B1* | 1/2016 | Wang | H01L 21/26586 |
| 9,576,908 B1* | 2/2017 | Lin | H01L 23/535 |
| 2002/0068433 A1 | 6/2002 | Trivedi et al. | |
| 2003/0178690 A1 | 9/2003 | Iyer | |
| 2007/0221998 A1* | 9/2007 | Park | H01L 27/105 |
| | | | 257/382 |
| 2009/0050965 A1* | 2/2009 | Okamoto | H01L 21/02639 |
| | | | 257/350 |
| 2010/0096756 A1* | 4/2010 | Tagami | H01L 21/76843 |
| | | | 257/762 |
| 2015/0011070 A1* | 1/2015 | Kim | H01L 29/66636 |
| | | | 438/300 |
| 2015/0028460 A1 | 1/2015 | Sharma et al. | |
| 2015/0118833 A1 | 4/2015 | Lei et al. | |
| 2016/0020301 A1* | 1/2016 | Park | H01L 29/66636 |
| | | | 257/283 |
| 2016/0126326 A1* | 5/2016 | Park | H01L 29/41775 |
| | | | 257/368 |

* cited by examiner

INTERCONNECTION STRUCTURE, FABRICATING METHOD THEREOF, AND SEMICONDUCTOR DEVICE USING THE SAME

RELATED APPLICATIONS

The present application is a Continuation Application of the U.S. application Ser. No. 14/993,024, filed Jan. 11, 2016, which claims priority to U.S. Provisional Application Ser. No. 62/216,902, filed Sep. 10, 2015, which is herein incorporated by reference.

BACKGROUND

The semiconductor integrated circuit (IC) industry has experienced rapid growth. Modern integrated circuits are made up of literally millions of active devices such as transistors and capacitors. Technological advances in IC materials and design have produced generations of ICs where each generation has smaller and more complex circuits than the previous generation. These devices are initially isolated from each other, but are later interconnected together through multiple metal layers to form functional circuits. As the IC becomes increasingly more complex, the interconnect structure also becomes more complex, resulting in increasing number of metal layers.

Interconnect structures may include lateral interconnections, such as metal lines (wirings), and vertical interconnections, such as conductive vias and contacts. However, complex interconnects limit performance and the density of modern integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
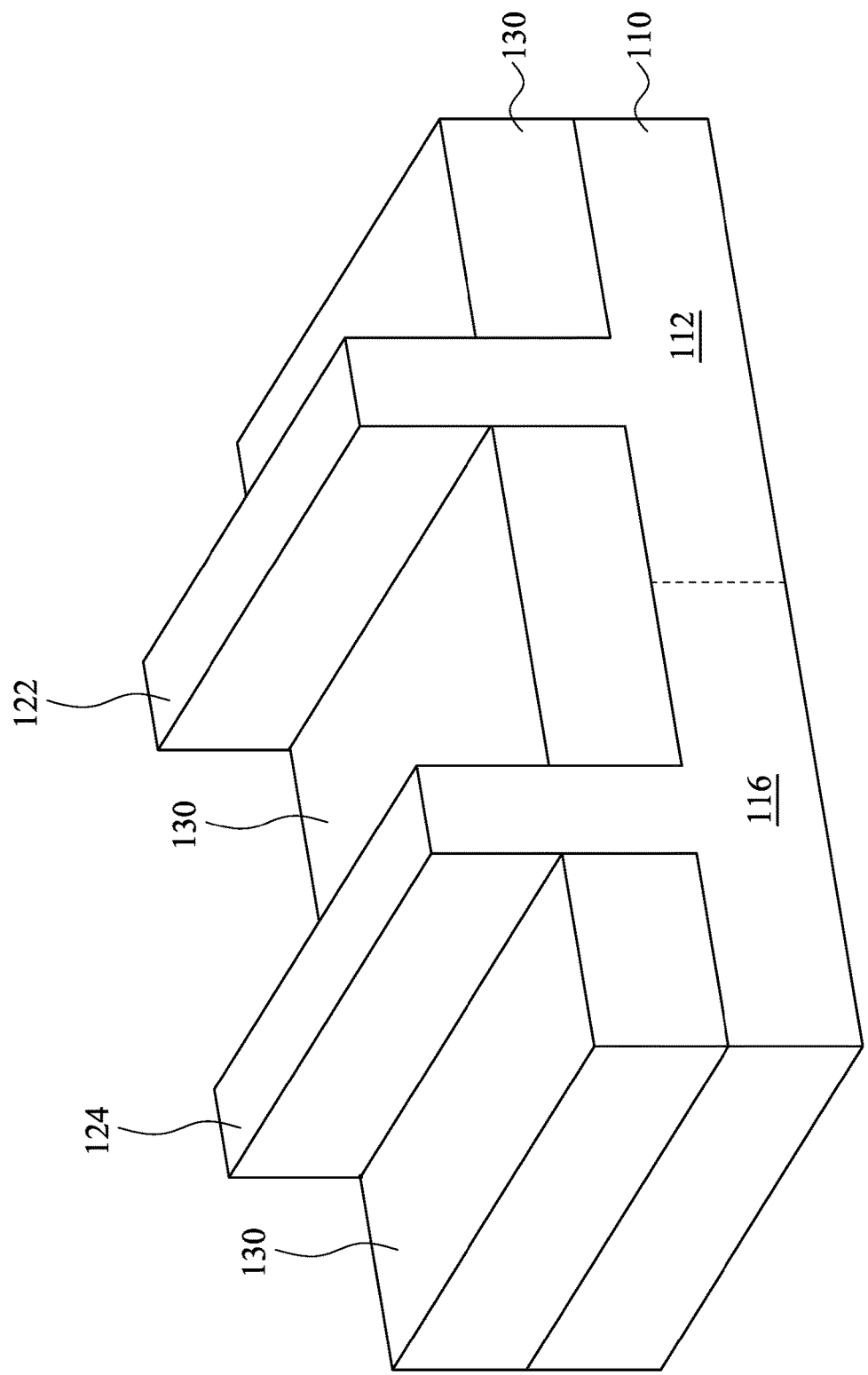
FIG. 1A to FIG. 1E are schematic oblique views of a method for manufacturing a FinFET device at various stages, in accordance with some embodiments of the present disclosure.

The following disclosure provides many different embodiments, or examples, for implementing different features of the provided subject matter. Specific examples of devices and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As semiconductor device sizes continue to shrink, meeting conductivity requirements as well as reliability in multiple metallization fabrication has become increasingly more difficult. For example, the formation of an interconnect structure which includes metal lines and conductive vias that interconnect metal lines from different layers of integrated circuit (IC) devices generally requires a low resistance but also a barrier layer blocking the conductive metal in the conductive vias diffusing into the ILD layer. To lower the RC delay in the IC devices, the barrier layer also plays a role in governing the resistivity of interconnects. The disclosure relates to a method of reducing resistance of interconnection structure in a semiconductor device, such as a FinFET device.

FIG. 1A to FIG. 1E are schematic oblique views of a method for manufacturing a FinFET device at various stages, in accordance with some embodiments of the present disclosure. Reference is made to FIG. 1A. A substrate 110 is provided. In some embodiments, the substrate 110 may be a semiconductor material and may include known structures including a graded layer or a buried oxide, for example. In some embodiments, the substrate 110 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate 110. Alternatively, the silicon substrate 110 may be an active layer of a semiconductor-on-insulator (SOI) substrate or a multi-layered structure such as a silicon-germanium layer formed on a bulk silicon layer.

A plurality of p-well regions 116 and a plurality of n-well regions 112 are formed in the substrate 110. One of the n-well regions 112 is formed between two of the p-well regions 116. The p-well regions 116 are implanted with P dopant material, such as boron ions, and the n-well regions 112 are implanted with N dopant material such as arsenic ions. During the implantation of the p-well regions 116, the n-well regions 112 are covered with masks (such as photoresist), and during implantation of the n-well regions 112, the p-well regions 116 are covered with masks (such as photoresist).

A plurality of semiconductor fins 122, 124 are formed on the substrate 110. The semiconductor fins 122 are formed on the p-well regions 116, and the semiconductor fins 124 are formed on the n-well regions 112. In some embodiments, the semiconductor fins 122, 124 include silicon. It is note that the number of the semiconductor fins 122, 124 in FIG. 1A is illustrative, and should not limit the claimed scope of the present disclosure. A person having ordinary skill in the art may select suitable number for the semiconductor fins 122, 124 according to actual situations.

The semiconductor fins 122, 124 may be formed, for example, by patterning and etching the substrate 110 using photolithography techniques. In some embodiments, a layer of photoresist material (not shown) is deposited over the substrate 110. The layer of photoresist material is irradiated (exposed) in accordance with a desired pattern (the semiconductor fins 122, 124 in this case) and developed to remove a portion of the photoresist material. The remaining photoresist material protects the underlying material from subsequent processing steps, such as etching. It should be noted that other masks, such as an oxide or silicon nitride mask, may also be used in the etching process.

A plurality of isolation structures 130 are formed on the substrate 110. The isolation structures 130, which act as a shallow trench isolation (STI) around the semiconductor fins 122, 124 may be formed by chemical vapor deposition (CVD) techniques using tetra-ethyl-ortho-silicate (TEOS) and oxygen as a precursor. In yet some other embodiments, the isolation structures 130 are insulator layers of a SOI wafer.

Figure 1B:
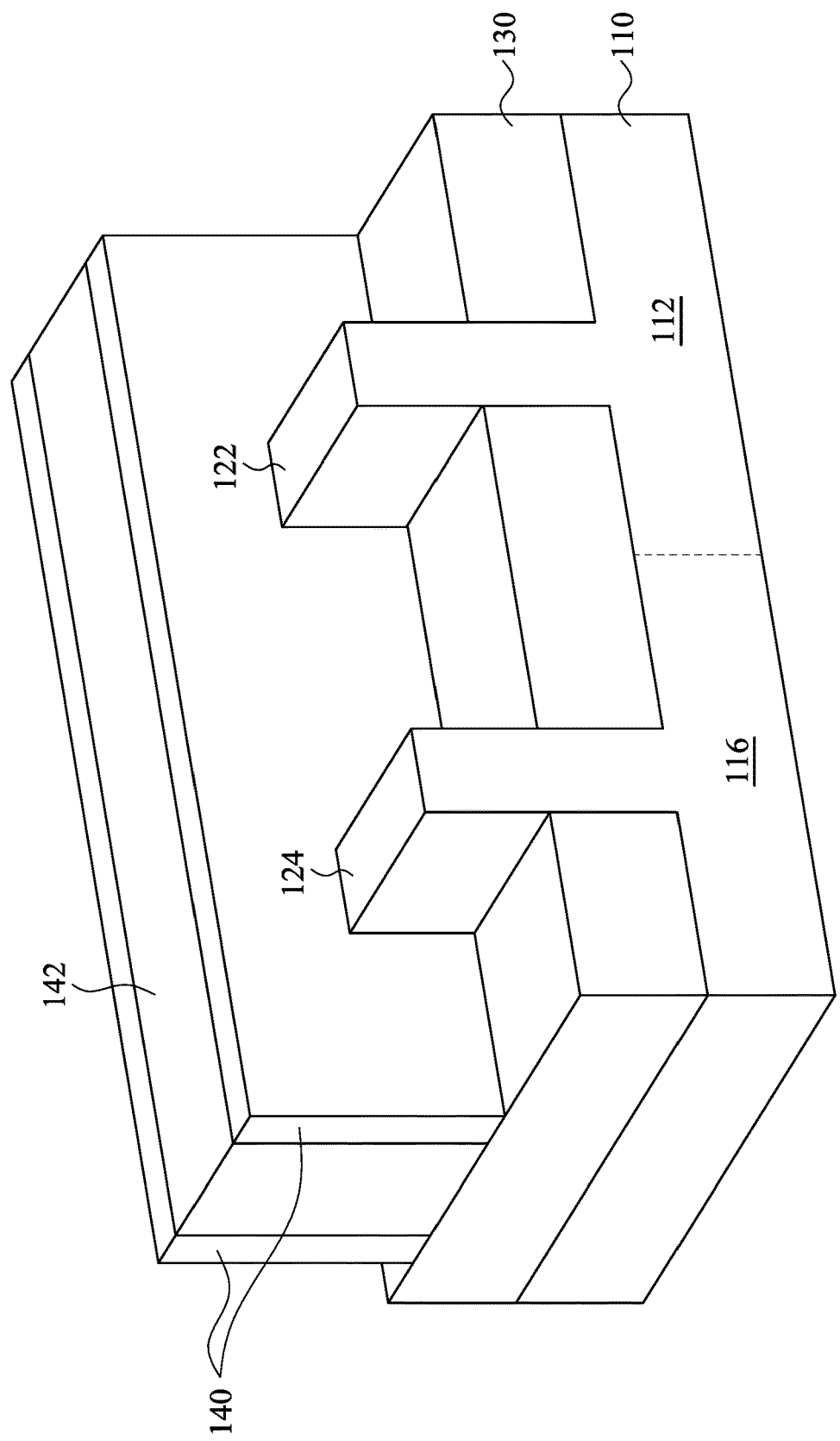

Reference is made to FIG. 1B. At least one dummy gate 142 is formed on portions of the semiconductor fins 122, 124 and exposes another portions of the semiconductor fins 122, 124. The dummy gate 142 may be formed crossing multiple semiconductor fins 122, 124. A plurality of gate spacers 140 are formed over the substrate 110 and along the side of the dummy gate 142. In some embodiments, the gate spacers 140 may include silicon oxide, silicon nitride, silicon oxynitride, or other suitable material. The gate spacers 140 may include a single layer or multilayer structure. A blanket layer of the gate spacers 140 may be formed by CVD, PVD, ALD, or other suitable technique. Then, an anisotropic etching is performed on the blanket layer to form a pair of the gate spacers 140 on two sides of the dummy gate 142. In some embodiments, the gate spacers 140 are used to offset subsequently formed doped regions, such as source/drain regions. The gate spacers 140 may further be used for designing or modifying the source/drain region (junction) profile.

Figure 1C:
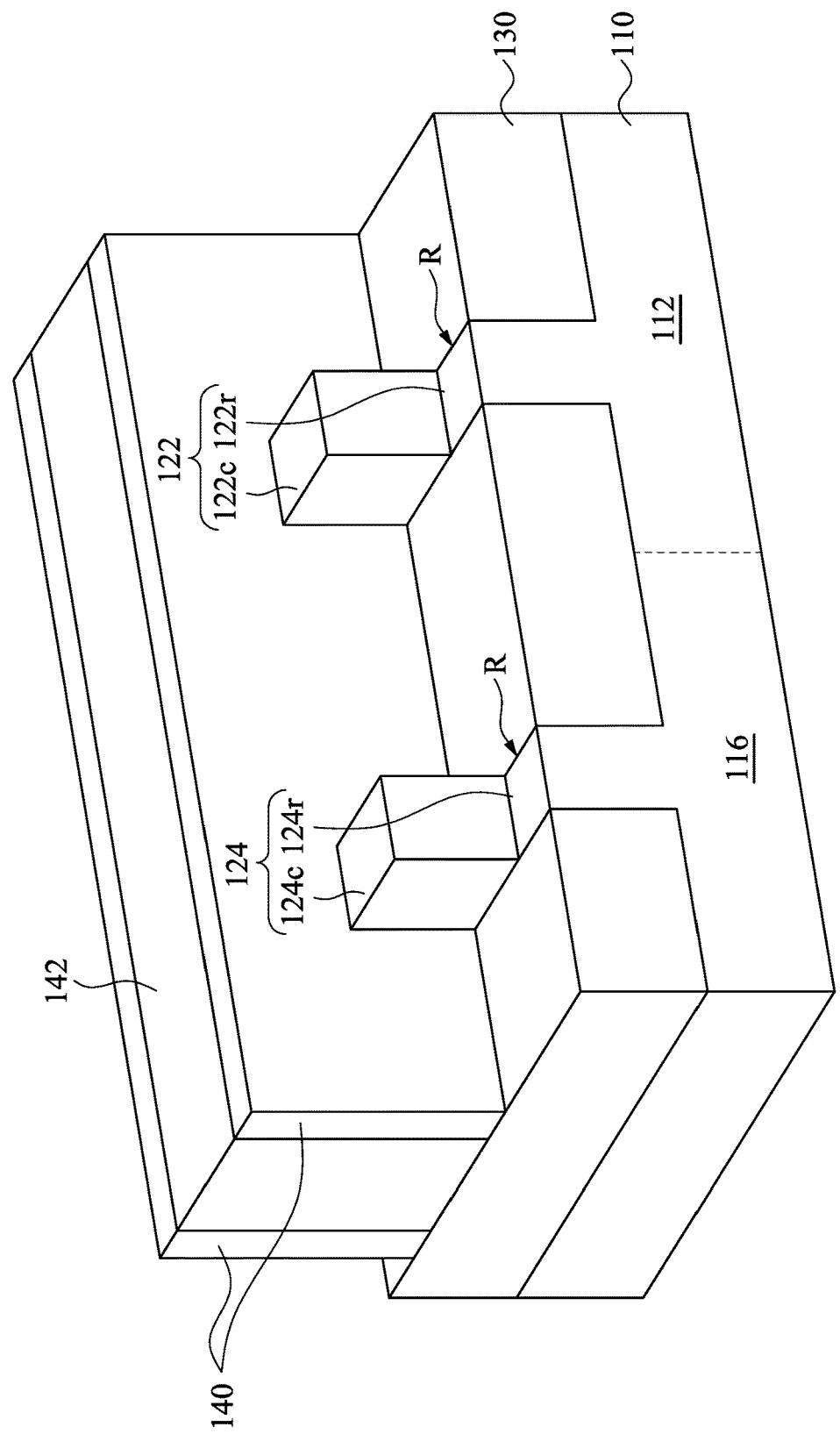

Reference is made to FIG. 1C. A portion of the semiconductor fins 122, 124 exposed both by the dummy gate 142 and the gate spacers 142 are partially removed (or partially trenched) to form trenches 126 in the semiconductor fins 122, 124. In some embodiments, the trenches 126 are formed with the dielectric fin sidewall structures 125 as its upper portion. In some embodiments, sidewalls of the trenches 126 are substantially and vertical parallel to each other. In some other embodiments, the trenches 126 are formed with a non-vertical parallel profile.

In FIG. 1C, the semiconductor fin 122 includes at least one trenched portion 122r and at least one channel portion 122c. The trench 126 is formed on the trenched portion 122r, and the dummy gate 142 covers a portion of the channel portion 122c. The semiconductor fin 124 includes at least one trenched portion 124r and at least one channel portion 124c. The trench 126 is formed on the trenched portion 124r, and the dummy gate 142 covers a portion of the channel portion 124c.

The trenching process may include dry etching process, wet etching process, and/or combination thereof. The trenching process may also include a selective wet etch or a selective dry etch. A wet etching solution includes a tetramethylammonium hydroxide (TMAH), a HF/HNO$_3$/CH$_3$COOH solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include NH$_4$OH, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include CF$_4$, NF$_3$, SF$_6$, and He. Dry etching may also be performed anisotropically using such mechanisms as DRIE (deep reactive-ion etching).

Figure 1D:
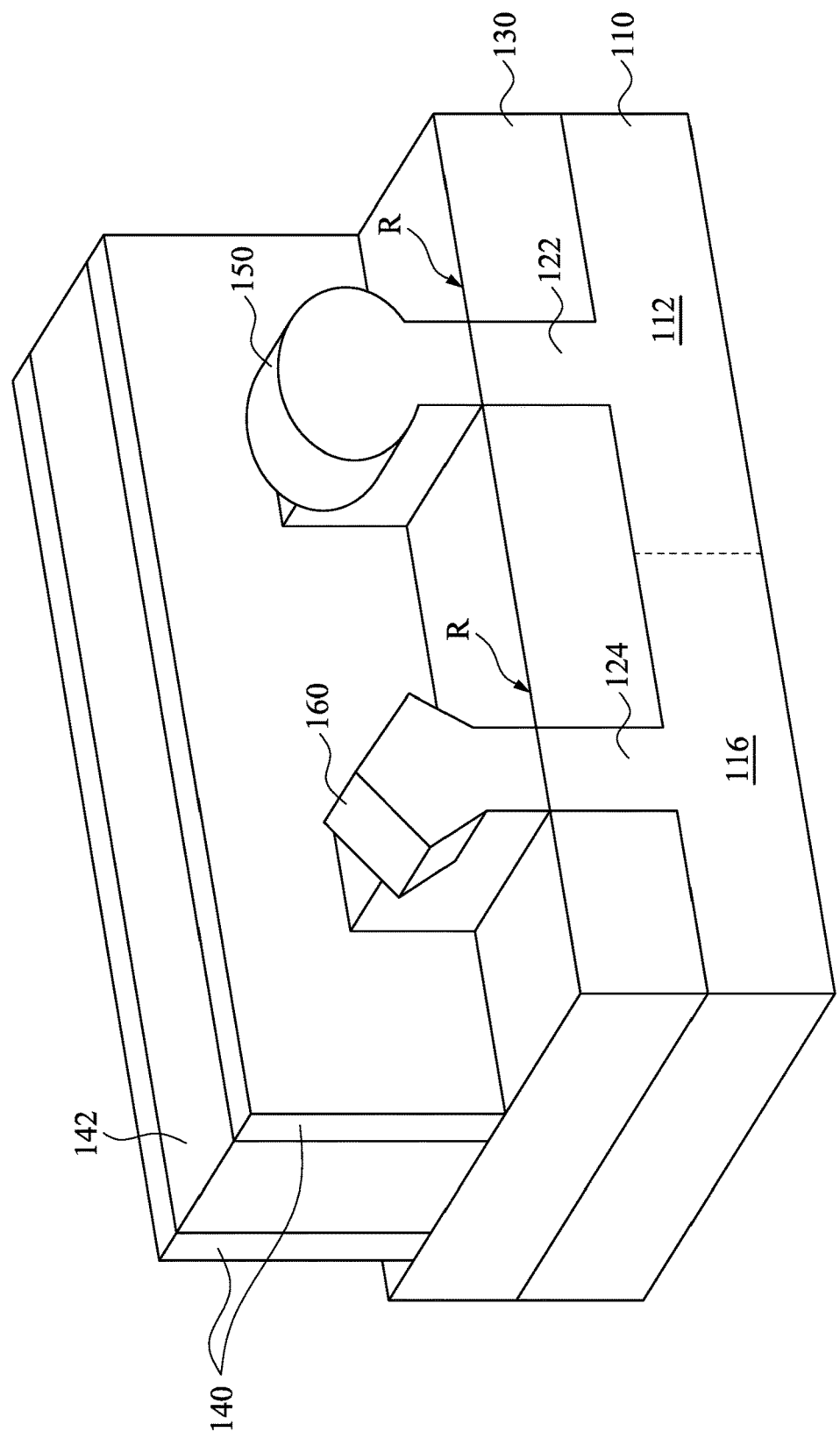

Reference is made to FIG. 1D. A plurality of epitaxy structures 160 are respectively formed in the trenches 126 of the semiconductor fins 124, and a plurality of epitaxy structures 150 are respectively formed in the trenches 126 of the semiconductor fins 122. The epitaxy structure 160 is separated from the adjacent epitaxy structure 150. The epitaxy structures 150 and 160 protrude from the trenches R. The epitaxy structures 160 can be n-type epitaxy structures, and the epitaxy structures 150 can be p-type epitaxy structures. The epitaxy structures 150 and 160 may be formed using one or more epitaxy or epitaxial (epi) processes, such that Si features, SiGe features, and/or other suitable features can be formed in a crystalline state on the semiconductor fins 122, 124. In some embodiments, lattice constants of the epitaxy structures 150 and 160 are different from lattice constants of the semiconductor fins 122, 124, and the epitaxy structures 150 and 160 are strained or stressed to enable carrier mobility of the SRAM device and enhance the device performance. The epitaxy structures 150 and 160 may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP).

In some embodiments, the epitaxy structures 150 and 160 are formed in different epitaxy processes. The epitaxy structures 160 may include SiP, SiC, SiPC, Si, III-V compound semiconductor materials or combinations thereof, and the epitaxy structures 150 may include SiGe, SiGeC, Ge, Si, III-V compound semiconductor materials, or combinations thereof. During the formation of the epitaxy structures 160, n-type impurities such as phosphorous or arsenic may be doped with the proceeding of the epitaxy. For example, when the epitaxy structure 160 includes SiC or Si, n-type impurities are doped. Moreover, during the formation of the epitaxy structures 150, p-type impurities such as boron or BF$_2$ may be doped with the proceeding of the epitaxy. For example, when the epitaxy structure 150 includes SiGe, p-type impurities are doped. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 122, 124 (e.g., silicon). Thus, a strained channel can be achieved to increase carrier mobility and enhance device performance. The epitaxy structures 150 and 160 may be in-situ doped. If the epitaxy structures 150 and 160 are not in-situ doped, a second implantation process (i.e., a junction implant process) is performed to dope the epitaxy structures 150 and 160. One or more annealing processes may be performed to activate the epitaxy structures 150 and 160. The annealing processes include rapid thermal annealing (RTA) and/or laser annealing processes.

In some embodiments, the epitaxy structure 150 has a top portion and a body portion disposed between the top portion and the substrate 110. The width of the top portion is wider than a width of the body portion. The epitaxy structure 160 has a top portion and a body portion disposed between the top portion and the substrate 110. A width of the top portion is wider than a width of body portion. The epitaxy structures 150 and 160 are utilized as source/drain electrodes of the FinFET device 100.

In some embodiments, the epitaxy structures 150 and 160 have different shapes. The top portions of the epitaxy structures 160 can have at least one substantially facet surface present above the isolation structures 130, and the top portions of the epitaxy structures 150 can have at least one non-facet (or round) surface present above the isolation structures 130, and the claimed scope is not limited in this respect.

Figure 1E:
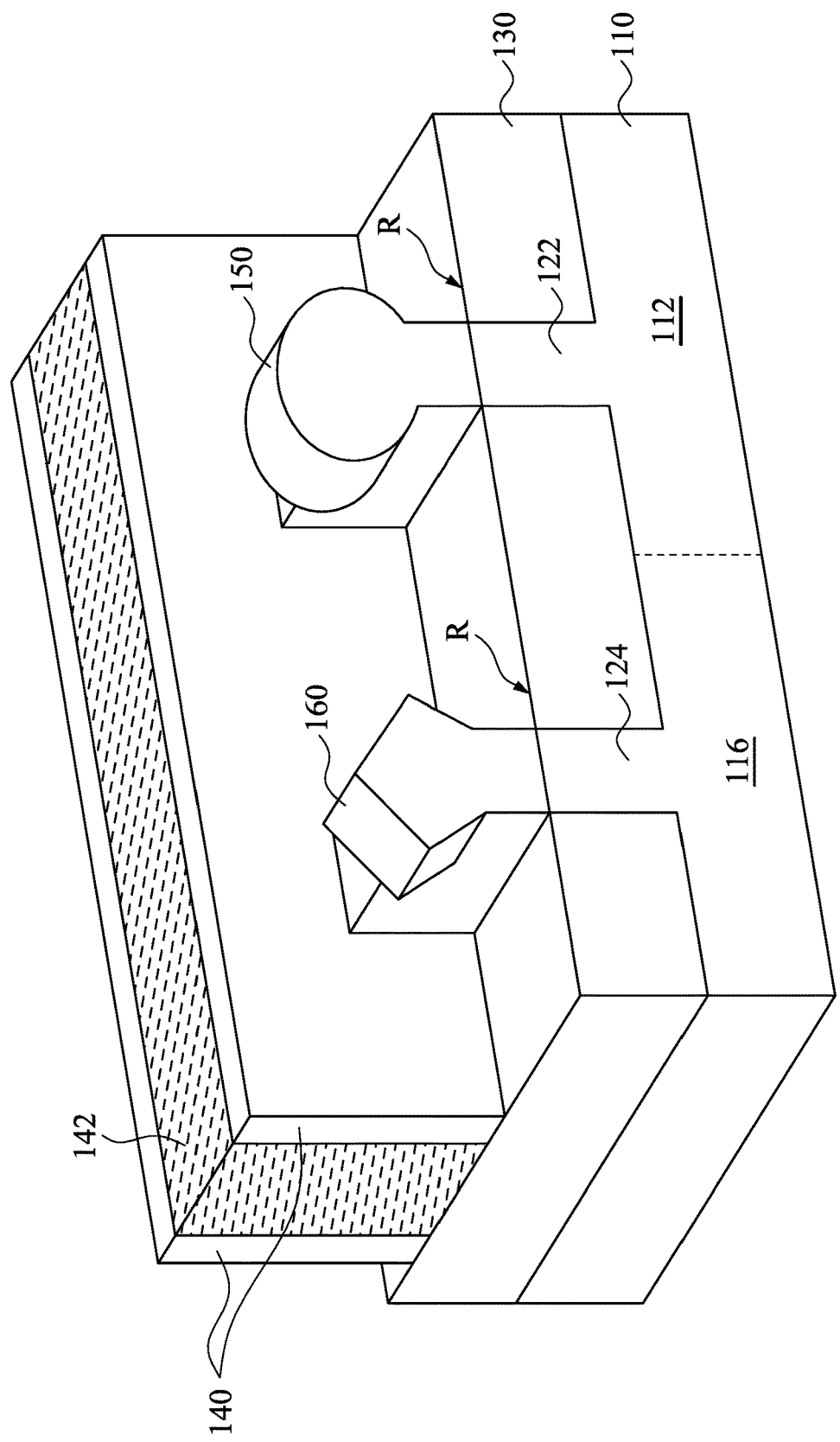

Reference is made to FIG. 1E. After the epitaxy structures 150 and 160 are formed, the dummy gate 142 is removed, thus a trench is formed between the gate spacer 140. The isolation structure 130 and a portion of the semiconductor fins 122, 124 are exposed from the trench. The dummy gate 142 can be removed by performing one or more etching processes. A gate stack 170 is formed and fills the trench. The gate stack 170 includes a gate electrode and a gate dielectric disposed between the gate electrode and the isolation structures 130. The gate dielectric and the gate electrode can be respectively formed by a deposition process, such as an ALD process, a CVD process, a PVD process or a sputter deposition process. The gate dielectric is made of dielectric material such as, silicon nitride, silicon oxinitride, dielectric with a high dielectric constant (high-k), and/or combinations thereof. In some embodiments, the gate electrode is a metal electrode. In some embodiments, the gate stack 170 further includes a cap layer on the gate electrode.

After the FinFET device 100 is fabricated, an interconnection structure is formed for interconnecting the electrodes of the FinFET device to other devices. Details of fabricating the interconnection structure are discussed in FIG. 2A to FIG. 2F, in which FIG. 2A to FIG. 2F are local cross-sectional views of a method of fabricating interconnection structure in a FinFET device.

Figure 2A:
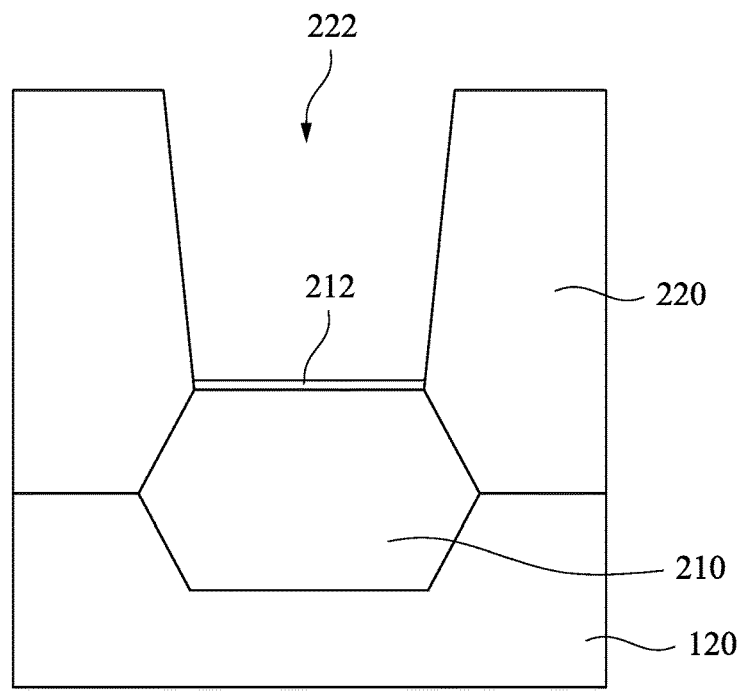
FIG. 2A to FIG. 2F are local cross-sectional views of a method of fabricating an interconnection structure in a FinFET device.

Reference is made to FIG. 2A. A dielectric layer 220 is formed on the FinFET device. The dielectric layer 220 covers the epitaxy structure 210 and the fin 120 around the epitaxy structure 210. The fin 120 can be any one of the fins 122, 124 in FIG. 1D, and the epitaxy structure 210 can be any one of the epitaxy structures 150 and 160 as discussed in FIG. 1D. The dielectric layer 220 may be an interlayer dielectric (ILD) and may contain an oxide material or a low-k material. The dielectric layer 220 may be formed by, for example, a chemical vapor deposition (CVD) processing step, a spin-on processing step, or combination thereof. The dielectric layer 220 is provided to isolate conductive features formed on different and/or the same layers.

An opening 222 is formed in the dielectric layer 220. In some embodiments, there is a plurality of the openings formed in the dielectric layer 220. The opening 222 may be, for example, contact openings, via openings, single damascene openings, dual damascene openings, or combinations thereof. The opening 222 may be formed, for example, by forming a patterned photoresist layer (not shown) over the dielectric layer 220 and using a dry etch processing step to remove portions of the dielectric layer 220 to define the opening 222 by using the patterned photoresist layer (not shown) as a mask. Various suitable dry etch processes may be used. After the dry etch processing step, the patterned photoresist layer (not shown) is removed by, for example, a photolithographic removal process. Some of the epitaxy structure 210 are also removed during forming the opening 222. An oxide layer 212 is formed on the surface of the epitaxy structure 210 when the epitaxy structure 210 is exposed and reacts to the air.

Figure 2B:
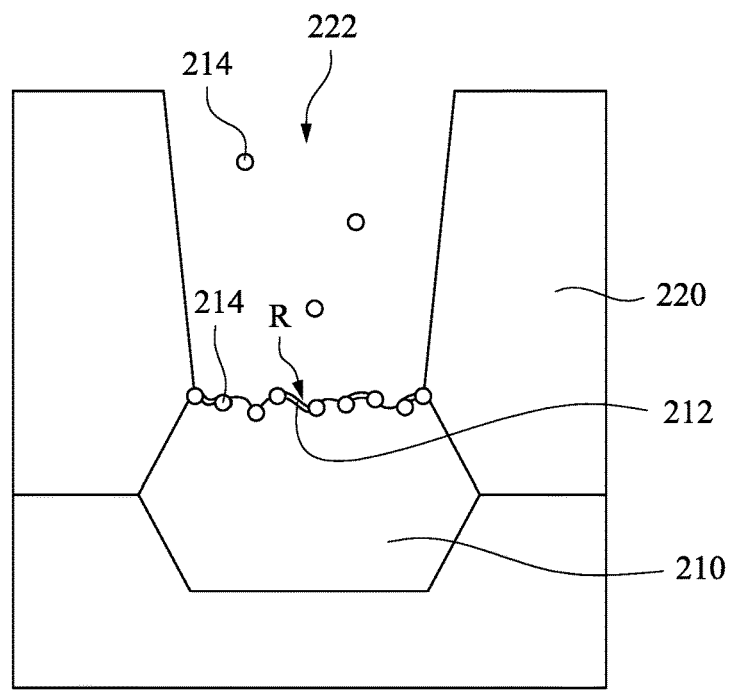

Reference is made to FIG. 2B, a removal process is performed to remove the oxide layer 212 present on the exposed epitaxy structure 210. The removal process can be a physical removal process, such as a sputter process. During the physical removal process, the energetic ions 214 bomb on the exposed portion of the epitaxy structure 210 and erode the oxide layer 212 thereon. The energetic ions 214 can be for example, Argon (Ar) ions, Neon (Ne) ions, Krypton (Kr), or Xenon (Xe) ions.

Particles of the oxide layer 212 and the epitaxy structure 210 are dislodged due to a bombardment of the energetic ions 214. The residual oxide layer 212 becomes broken and discontinuous after the removal process. The dislodging of the particles of the oxide layer 212 and the epitaxy structure 210 results in a rough and irregular surface of the epitaxy structure 210. In some embodiments, a plurality of recesses R are formed on the top of the epitaxy structure 210. The recesses R are arranged randomly on the surface of the epitaxy structure 210. The density of the recesses R is on the surface of the epitaxy structure 210 is also randomly. The depth of each of the recesses R is in a range from about 1.5 nm to about 3.5 nm, and the depth difference of the recesses R is in a range from about 0.5 nm to about 3 nm, which is corresponding to the RF power of generating the energetic ions 214. In some embodiments, the RF power of the sputter process is higher than 500 w, and the depth difference of the recesses R on the epitaxy structure 210 is in a range from about 1.5 nm to about 3 nm. In some embodiments, the RF power of the sputter process is lower than 400 w, and the depth difference of the recesses R is in a range from about 0.5 nm to about 1.5 nm. The depth difference of a p-type FinFET device is about 2 nm to about 20 nm higher than that of the n-type FinFET due to the etching rate of the p-type epitaxy structure, such as SiGe, is greater than the etching rate of the n-type epitaxy structure, such as SiP.

During the process of physical removal, some of the energetic ions 214, such as Argon (Ar) ions, Neon (Ne) ions, Krypton (Kr), or Xenon (Xe) ions are ejected into the epitaxy structure 210 and are embedded in the epitaxy structure 210. The distribution including the depth, the density, or the amount of the ions 214 present on the surface of the epitaxy structure 210 is random and irregular. The distribution of the ions 214 may relate to the RF power of providing the energetic ions 214.

Figure 2C:
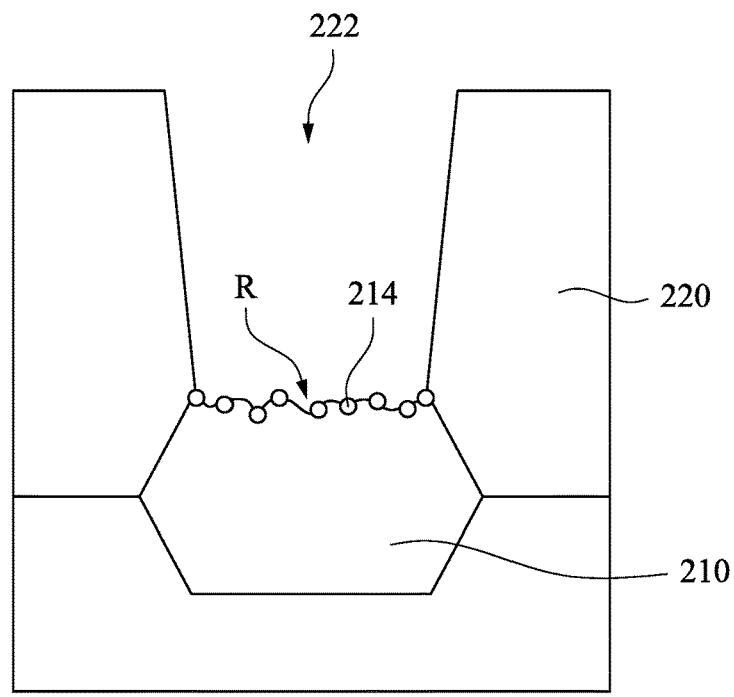

Reference is made to FIG. 2C. The oxide layer 212 (as shown in FIG. 2B) remain on the epitaxy structure is 210 is removed by performing a chemical removal process. The chemical removal process can be performed by using a chemical mixture including $NF_3$ and $NH_3$. However, other suitable chemical for removing the oxide layer 212 without destroying the epitaxy structure 210 can be utilized in the chemical removal process.

The oxide layer 212 is removed by performing both the physical removal process and the chemical removal process. The physical removal process is utilized to texture the surface of the epitaxy structure 210 thereby forming the rough and irregular surface of the epitaxy structure 210. Recesses R are formed on the surface of the epitaxy structure 210, and small amount of the ions 214 are ejected into the expitaxy structure 210 during the physical removal process. The surface area of the epitaxy structure 210 is increased because of the existence of the recesses R. The chmical removal process is utilized for removing the oxide layer 212. The ions 214 are not reacted with the chemical and still present in the epitaxy structure 210 after the chemical removal process is performed.

Figure 2D:
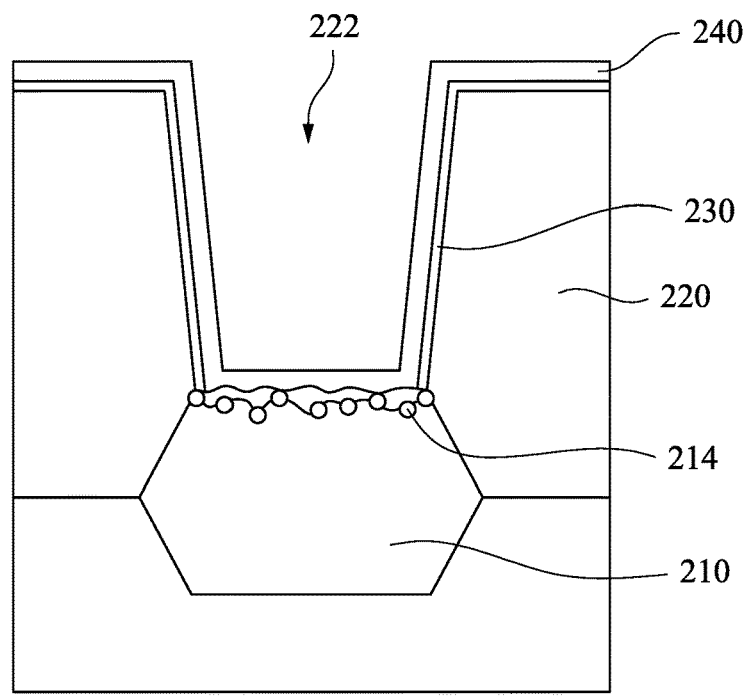

Reference is made to FIG. 2D. A metal layer 230 is formed to line the sidewalls and bottoms of the opening 222 and over the dielectric layer 220. In some embodiments, the metal layer 230 can be a metal alloy layer. The metal layer 230 includes metal for use in self-aligned silicide (salicide) technology, such as titanium (Ti), cobalt (Co), nickel (Ni), platinum (Pt), or tungsten (W). The metal layer 230 is formed by a deposition process, such as a CVD process, a PVD process or a sputter deposition process.

A barrier layer 240 is further formed on the metal layer 230. The barrier layer 240 may function as a barrier to prevent a subsequently formed conductor from diffusing into the underlying dielectric layer 220. In some embodiments, the barrier layer 240 includes tantalum (Ta), titanium (Ti) or the like. In some embodiments, the barrier layer 240 has a thickness of about 10 angstrom to about 250 angstroms. In some embodiments, a combined thickness of the metal layer 230 and the barrier layer 240 is less than about 120 angstroms to prevent a gap filling issue during the subsequent opening filling process. The barrier layer 240 is deposited by using PVD, CVD, PECVD, LPCVD, or other well-known deposition techniques.

Figure 2E:
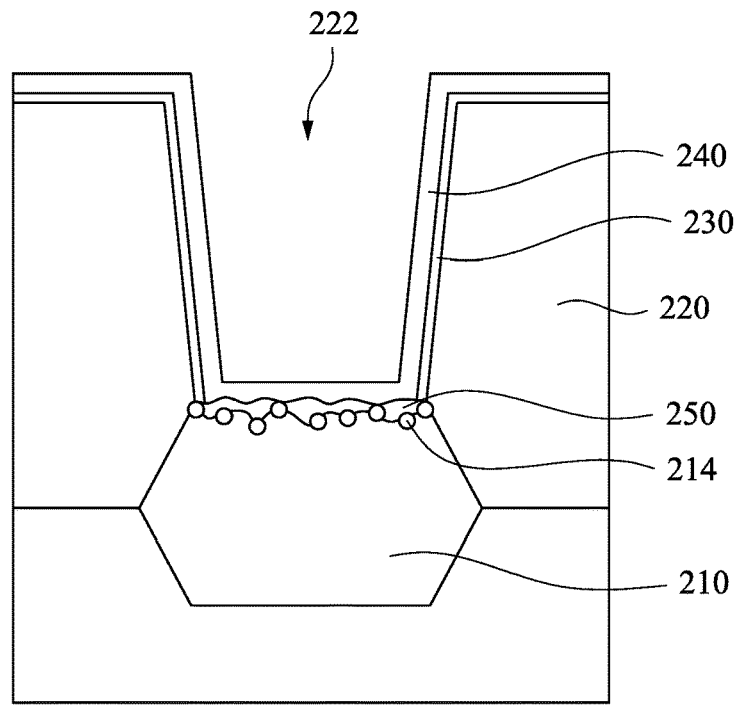

Reference is made to FIG. 2E. An anneal process is performed to form a silicide 250 on the epitaxy structure 210. Annealing process is utilized to convert the amorphous silicide film to a lower-resistance polycrystalline phase. The salicide process is sometimes used to form silicide contacts to the source and drain region to solve the problem of critical dimension tolerance. In some embodiments, the metal layer is a titanium layer and is annealed to become a titanium silicide 250. The anneal process is performed to form high resistivity Ti rich phase, and the thickness of the titanium silicide is in a range from about 30 angstroms to about 160 angstroms. In some embodiments, the titanium silicide 250 can be $TiSi_2$ since the epitaxy structure 210 is an n-type epitaxy structure. In some embodiments, the titanium silicide 250 can be TiSiGe since the epitaxy structure 210 is a p-type epitaxy structure.

Since the surface of the epitaxy structure 210 is textured, and the recesses R are formed on the epitaxy structure 210, the interface between the epitaxy structure 210 and the silicide 250 is irregular and rough, and the surface area of the epitaxy structure 210 in contact with the silicide 250 is increased accordingly. The ions 214 from the physical removal process are remained in the silicide 250. The depth difference at the interface between the epitaxy structure 210 and the silicide 250 is in a range from about 1.5 nm to about 3.5 nm.

Figure 2F:
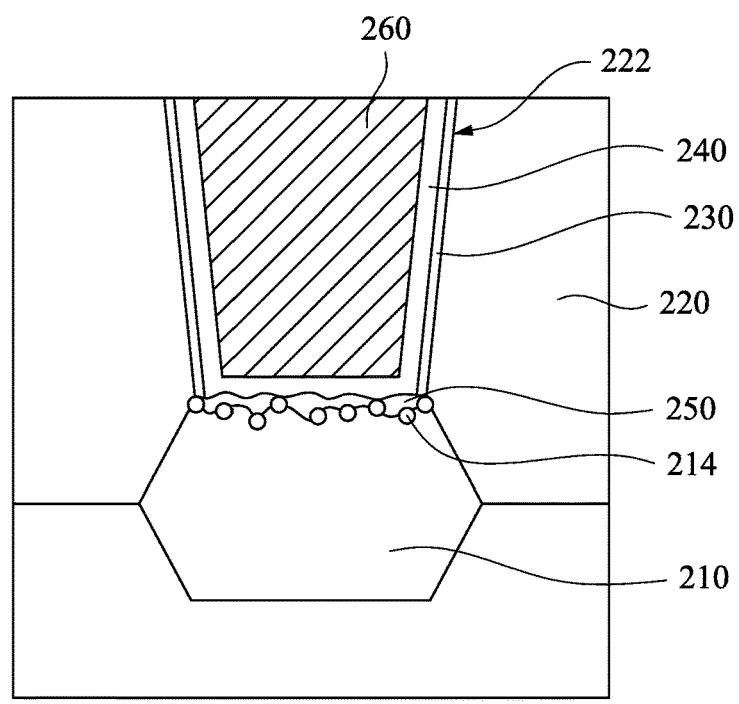

Reference is made to FIG. 2F. A conductor 260 is formed over the barrier layer 240 to fill the opening 222. In some embodiments, the conductor 260 is formed as an interconnect structure in the dielectric layer 220. In some embodiments, the conductor 260 is formed by a deposition process, such as a CVD process, a PVD process or a sputter deposition process. In some embodiments, the conductor 260 includes tungsten (W), copper (Cu), or cobalt (Co).

The bottom of the metal layer 230 is reacted with the epitaxy structure 210 and becomes the silicide 250. Therefore, the remaining metal layer 230 is present between the barrier layer 240 and the sidewall of the opening 222 and is not present between the silicide 250 and the barrier layer 240. Namely, the bottom of the barrier layer 240 is directly in contact with the silicide 250, such that the contact resistance of the interconnection structure is reduced.

The portion of conductor 260 over the dielectric layer 220 is removed. In some embodiments, the removing process is chemical mechanical polishing (CMP) process performed to remove the excess portions of the conductor 260, the barrier layer 240, and the metal layer 230 outside the opening 222, thus exposing the top surface of the dielectric layer 220 and achieving a planarized surface.

The interconnection structure including the conductor 260 and the silicide 250 is formed in the dielectric layer 230 and is connected to the epitaxy structure 210. Since the interface between the silicide 250 and the epitaxy structure 210 becomes rough and irregular, the contact area therebetween is increased accordingly. Therefore, the resistance of the interconnetcion structure is reduced due to the increased contact area.

Figure 3:
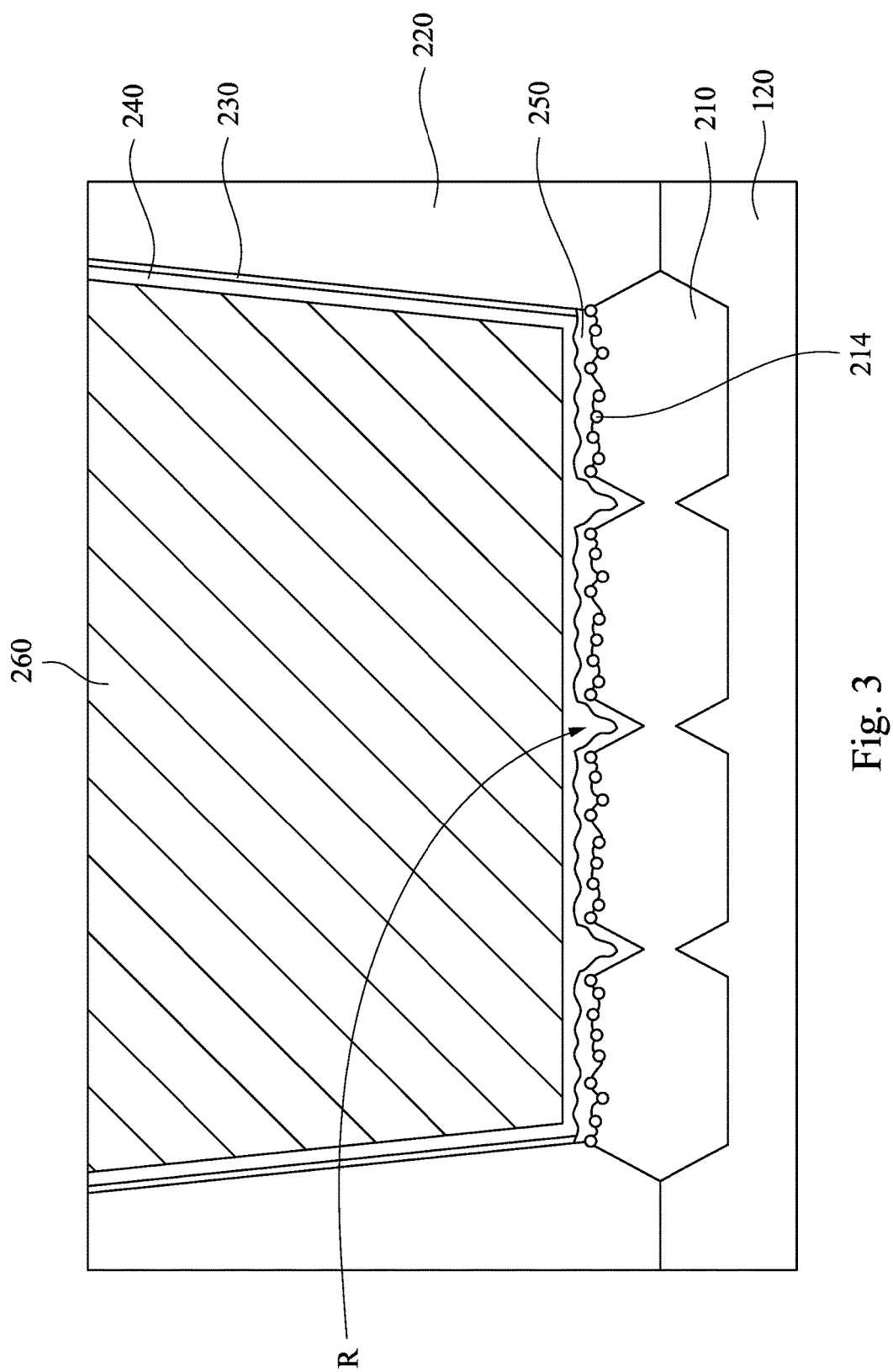
FIG. 3 is a local cross-sectional view of the interconnection structure of some embodiments of the disclosure.

Reference is made to FIG. 3, which is a local cross-sectional view of the interconnection structure of some other embodiments of the disclosure. The fin 120 may have a plurality of the epitaxy structures 210 thereon. As discussed in FIG. 2A to FIG. 2F, a physical removal process and a chemical process are performed to texture the surface of the epitaxy structures 210 and to remove the oxide layer on the exposed portion of the epitaxy structures 210. The connected epitaxy structures 210 form a mountain-like top surface, and the depth difference of the top surface of the epitaxy structures 210 is greater than that of the single epitaxy structure 210. For example, the depth difference of the top surface of the epitaxy structures 210 is in a range from about 3 nm to about 25 nm, which is corresponding to the RF power of generating the energetic ions 214. In some embodiments, the RF power of the sputter process is higher than 500 w, and the depth difference of the surface of the epitaxy structures 210 is in a range from about 15 nm to about 25 nm. In some embodiments, the RF power of the sputter process is lower than 400 w, and the depth difference of the surface of the epitaxy structures 210 is in a range from about 3 nm to about 15 nm.

Accordingly, the thickness of the silicide 250 between the barrier layer 240 and the epitaxy structures 210 is not uniform, and the width of each of the epitaxy structures 210 is not the same. The difference between the adjacent epitaxy structures 210 is about 3 nm to about 20 nm. The difference of thickness of the silicide 250 is in a range from about 3 nm to about 25 nm.

The aforementioned interconnection structure is not limited to be utilized in FinFET device with epitaxy structure, but can be utilized to any suitable semiconductor device with silicide contact. For example, the aforementioned interconnection structure can be utilized for example, a nanowire component, as discussed in FIG. 4A to FIG. 4F.

Figure 4A:
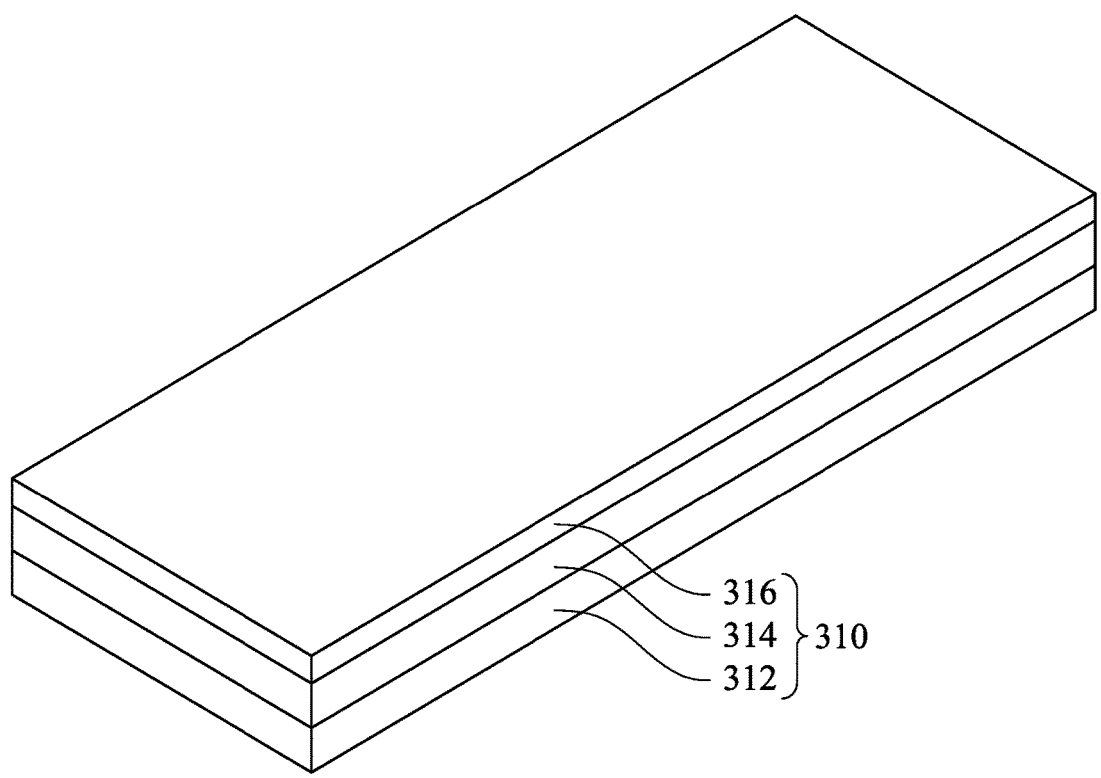
FIG. 4A to FIG. 4F are schematic oblique views of a method for manufacturing a semiconductor device at various stages, in accordance with some embodiments of the present disclosure.

Reference is made to FIG. 4A to FIG. 4F. FIG. 4A to FIG. 4F are schematic oblique views of a method for manufacturing a semiconductor device at various stages, in accordance with some embodiments of the present disclosure. Referring to FIG. 4A, the method begins with a semiconductor-on-insulator (SOI) structure 310. The SOI structure 310 includes a semiconductor substrate 312, a buried oxide (BOX) layer 314 and an SOI layer 316. In some embodiments, the SOI layer 316 is formed from a semiconductor material, such as silicon. The BOX layer 314 may include silicon oxide, silicon nitride or silicon oxynitride. The BOX layer 314 is present between the semiconductor substrate 312 and the SOI layer 316. In a greater detail, the BOX layer 314 may be present underlying the SOI layer 316 and at top of the semiconductor substrate 312, and the BOX layer 314 may be formed by implanting a high-energy dopant into the SOI structure 310 and then annealing the structure to form a buried oxide layer. In some other embodiments, the BOX layer 314 may be deposited or grown prior to the formation of the SOI layer 316. In yet some other embodiments, the SOI structure 310 may be formed using wafer-bonding techniques, where a bonded wafer pair is formed utilizing glue, adhesive polymer, or direct bonding.

Figure 4B:
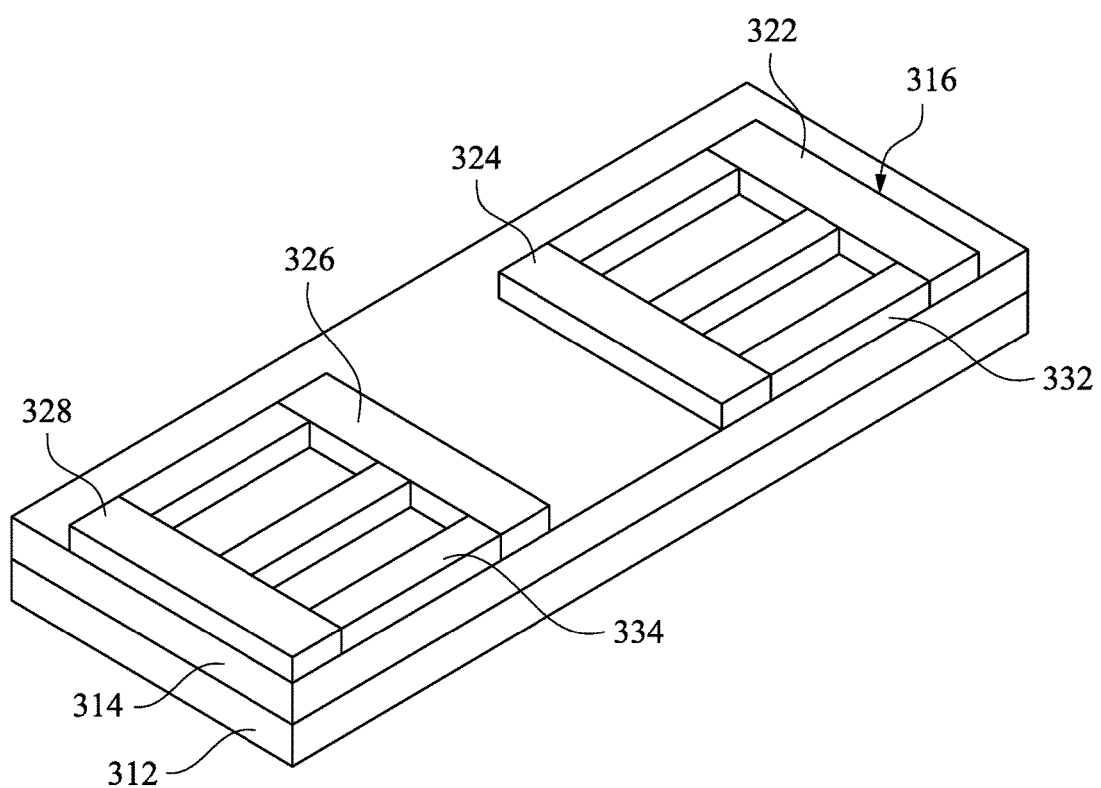

Reference is made to FIG. 4B. The SOI layer 316 is patterned to form pads 322, 324, 326 and 328 and connecting structures 332 and 334. For example, the pads 322, 324, 326 and 328 and the connecting structures 332 and 334 may be fabricated by using suitable processes such as photolithography and etching. The connecting structures 332 connect the pads 322 and 324. The connecting structures 334 connect the pads 326 and 328. In other words, at least one of the connecting structures 332 may have separate pads 322 and 324 on opposite sides thereof, and at least one of the connecting structures 334 may have separate pads 326 and 328 on the opposite sides thereof.

Figure 4C:
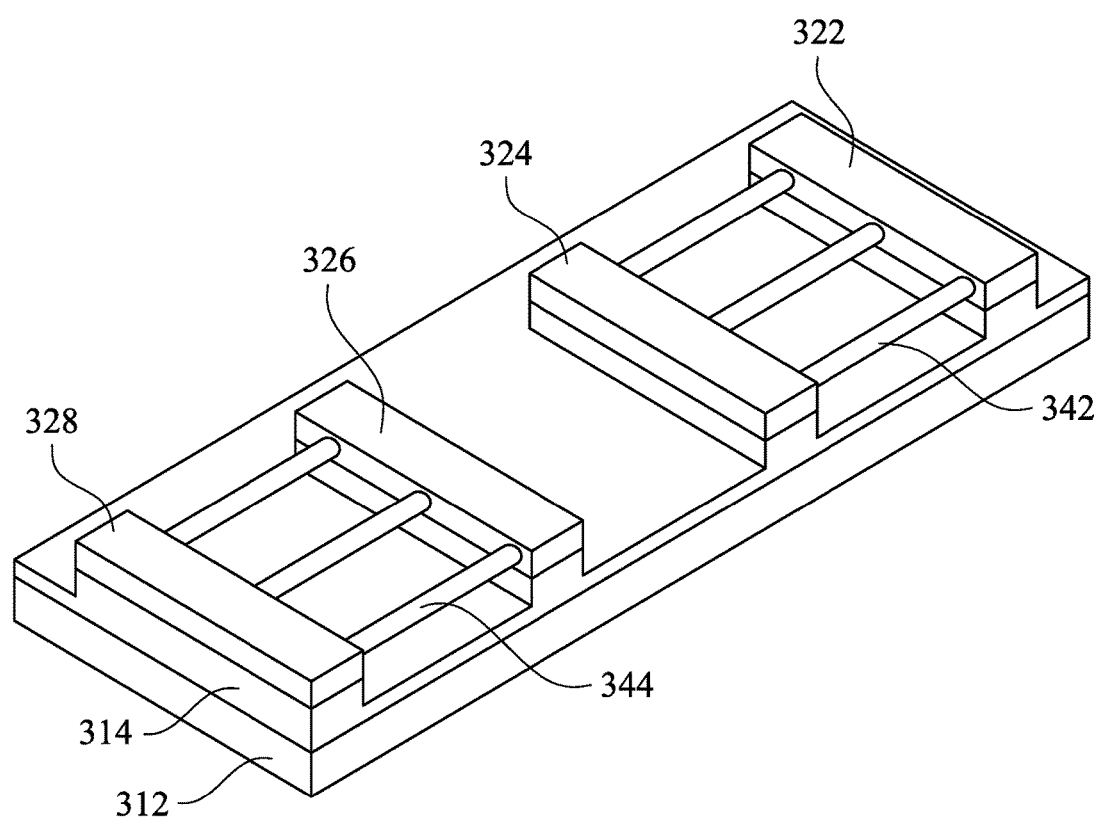

Reference is made to FIG. 4C. The connecting structures 332 and 334 are partially removed to form first nanowires 342 and second nanowires 344. In some embodiments, lower portions of the connecting structures 332 and 334 and underlying portions of the BOX layer 314 are removed by an isotropic etching process, so that the first nanowires 342 are formed as suspended between the pads 322 and 324, and the second nanowires 344 are formed as suspended between the pads 326 and 328. The isotropic etching is a form of etching that does not include a preferential direction. One example of an isotropic etching is wet etching. The isotropic etching process forms undercut regions that the first and second nanowires 342 and 344 are suspended over. In some embodiments, the isotropic etching may be performed using a diluted hydrofluoric acid (DHF). After the isotropic etching process, the first and second nanowires 342 and 344 may be smoothed to form elliptical shaped (and in some cases, cylindrical shaped) structures. In some embodiments, the smoothing process may be performed by an annealing process. Example annealing temperature may range from about 600° C. to about 1000° C., and the hydrogen pressure in the annealing process may range from about 7 torr to about 600 torr.

Figure 4D:
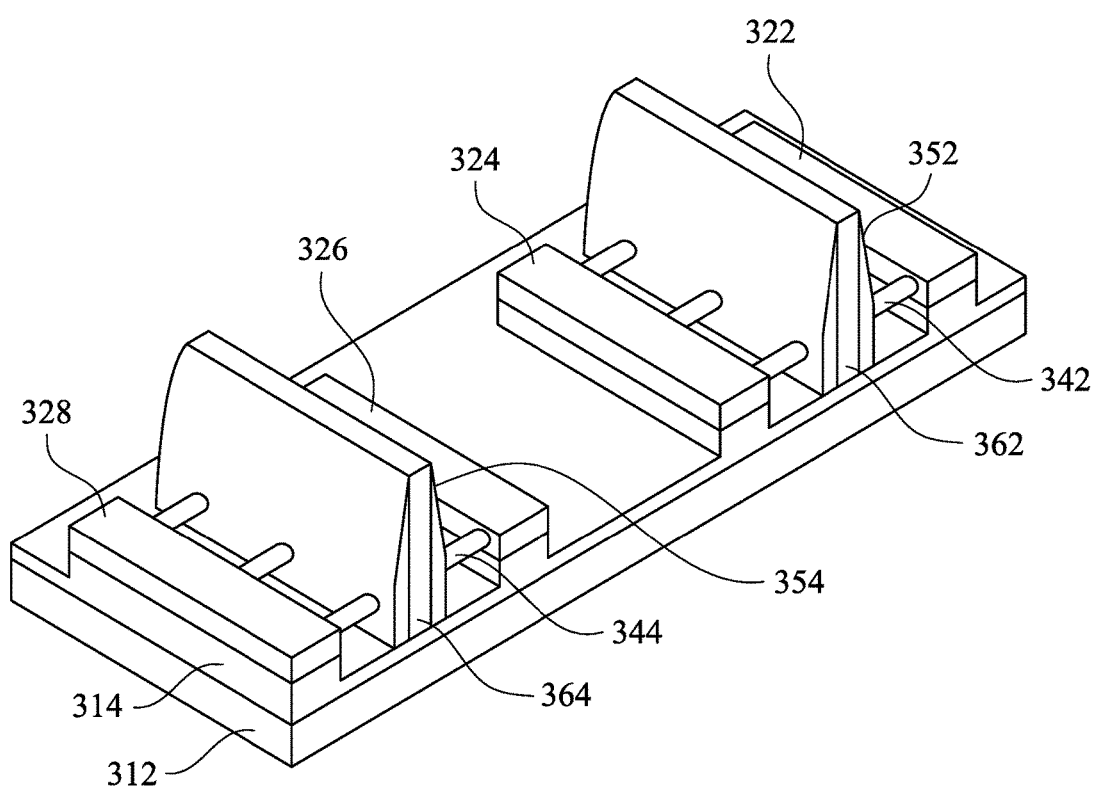

Reference is made to FIG. 4D. Spacers 352 are formed on opposite sidewalls of the dummy gate material layer 362, and spacers 354 are formed on opposite sidewalls of the dummy gate material layer 364. The method of forming the spacers 352 and 354 includes forming a dielectric layer and then performing an etching process to remove a portion of the dielectric layer.

Following the formation of the spacers 352 and 354, an n-type dopant may be introduced to the exposed portions of the first nanowires 342 that are adjacent to the spacers 352, so as to form n-type source/drain extension regions. Similarly, a p-type dopant may be introduced to the exposed portions of the second nanowires 344 that are adjacent to the spacers 354, so as to form p-type source/drain extension regions. An Example of the p-type dopant includes, but is not limited to, boron, aluminum, gallium and indium. An example of the n-type dopant includes, but is not limited to, antimony, arsenic and phosphorous.

In some embodiments, source/drain extension regions are formed in the first nanowires 342 and the second nanowires 344 using an in-situ doped epitaxial growth process followed by an annealing process to drive the dopant from the in-situ doped epitaxial semiconductor material into the first nanowires 342 and the second nanowires 344 to provide the extension regions. In some embodiments, the in-situ doped semiconductor material is formed using an epitaxial growth process. "In-situ doped" means that the dopant is incorporated into the in-situ doped semiconductor material during the epitaxial growth process that deposits the semiconductor containing material of the in-situ doped semiconductor material. When the chemical reactants are controlled, the depositing atoms arrive at the surface of the first and sheathed nanowires 342 and 344 and the pads 322, 324, 326 and 328 with sufficient energy to move around on the surface and orient themselves to the crystal arrangement of the atoms of the deposition surface. The epitaxial growth thickens the pads 322, 324, 326 and 328 and portions of the first nanowires 342 and the second nanowires 344 that are not covered by the dummy gate material layers 362 and 364, and the spacers 352 and 354.

Thereafter, ion implantation may be performed to the pads 322, 324, 326 and 328 to form deep source/drain regions. The deep source/drain regions may be formed using ion implantation. During the ion implant that provides the deep source/drain regions, the portions of the device in which the implant is not desirable may be protected by a mask, such as a photoresist mask. The deep source/drain regions in the pads 322 and 324 have the same conductivity dopant as the source/drain extension regions in the first nanowires 342, such as the n-type dopant, but the deep source/drain regions in the pads 322 and 324 have a greater dopant concentration then the source/drain extension regions in the first nanowires 342. Similarly, the deep source/drain regions in the pads 326 and 328 have the same conductivity dopant as the source/drain extension regions in the second nanowires 344, such as the p-type dopant, but the deep source/drain regions in the pads 326 and 328 have a greater dopant concentration then the source/drain extension regions in the second nanowires 344.

Figure 4E:
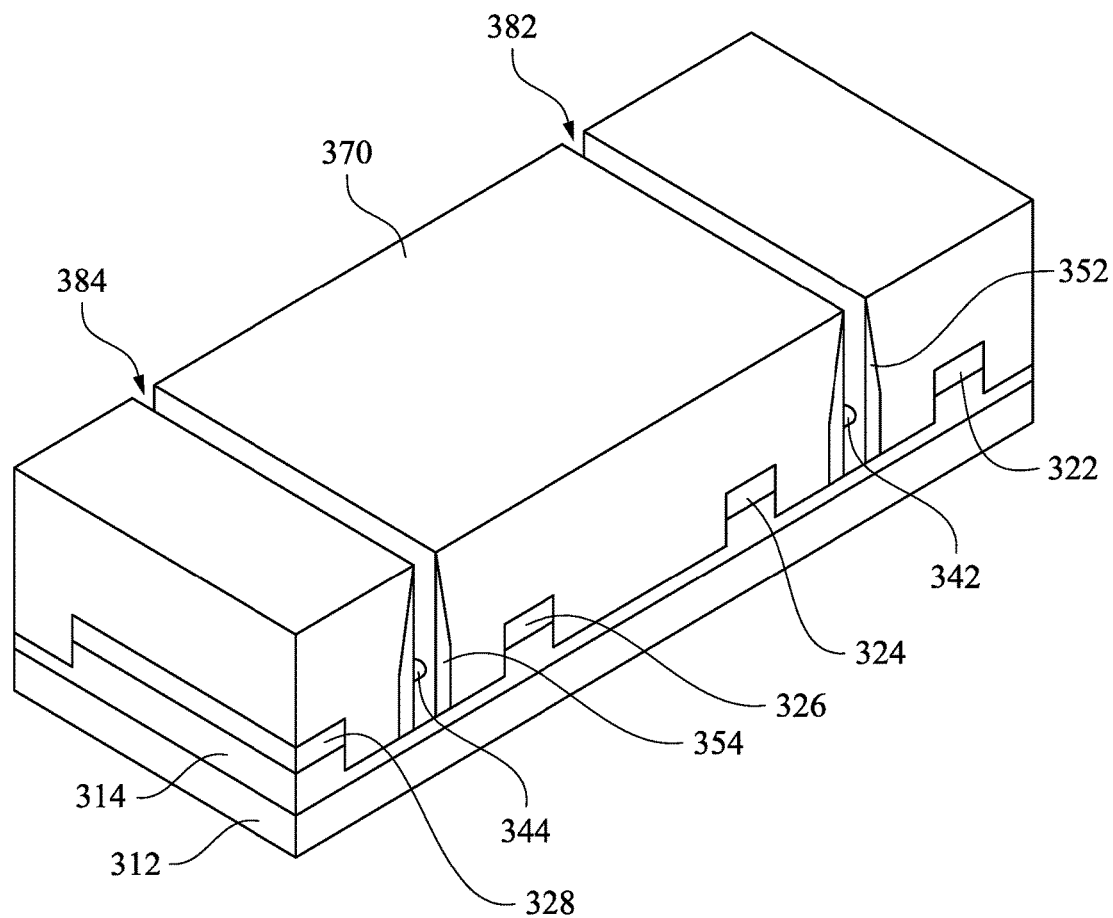

Reference is made to FIG. 4E. An interlayer dielectric (ILD) layer 370 is formed to cover the dummy gate material layers 362 and 364, the first nanowires 342 and the second nanowires 344. The ILD layer 370 may include silicon oxide, silicon nitride, silicon oxynitride, silicon carbide, a low-dielectric constant dielectric material, or combinations thereof. The ILD layer 370 can be formed by a deposition process, such as a CVD process. Afterwards, a portion of the ILD layer 370 is removed to expose top surfaces of the dummy gate material layers. The removing step may include performing a chemical-mechanical polishing (CMP) process. The dummy gate material layers are further removed by using suitable processes, such as wet etching. After removal of the dummy gate material layers, a first trench 382 is formed between the spacers 352, and a second trench 384 is formed between the spacers 354, and the first and second trenches 382 and 384 are spatially isolated from each other by the spacers 352, 354 and the ILD layer 370.

Figure 4F:
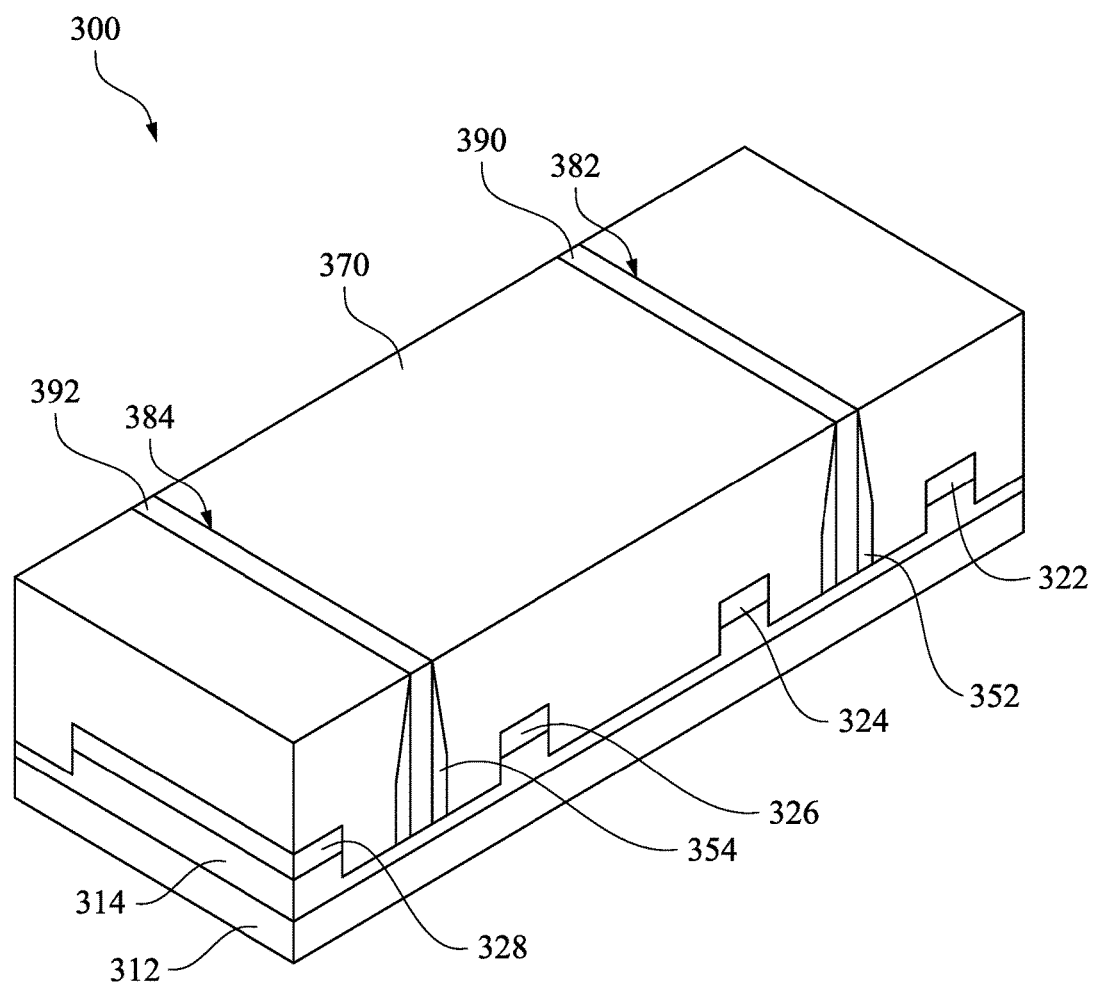

Reference is made to FIG. 4F. Gate stacks 390 and 392 are formed and fill the trenches 382 and 384. The gate stacks 390 and 392 respectively include a gate dielectric wrapping the nanowires, a gate electrode wrapping the gate dielectric, and a cap layer wrapping the gate electrode.

After the semiconductor device 300 is formed, a plurality of interconnection structures are formed in the ILD layer 370 to connect to the pads 322, 324, 326 and 328. A cross-sectional view of the interconnection structure and the pads is illustrated in FIG. 4.

Figure 5:
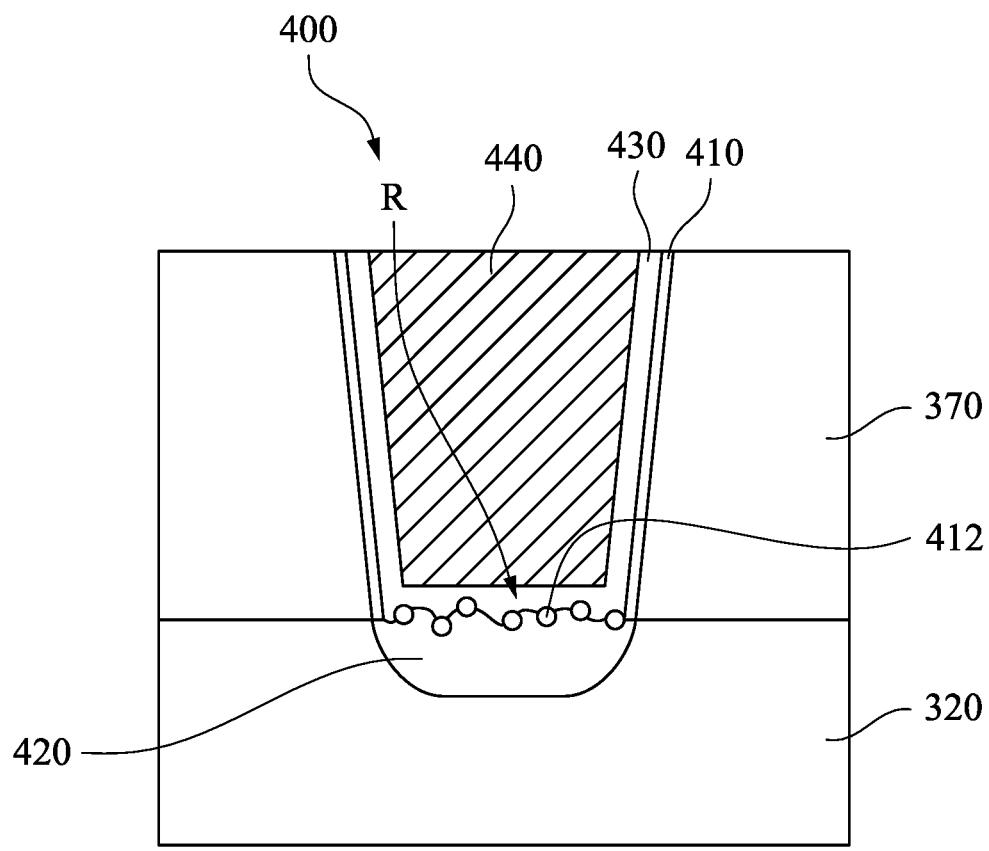
FIG. 5 is a local cross-sectional view of the interconnection structure of some embodiments of the disclosure.

As shown in FIG. 5, an interconnection structure 400 is formed in the ILD layer 370 and is in contact with the pad 320. The pad 320 can be any one of the pad 322, 324, 326 and 328. The interconnection structure 400 includes a metal layer 410, a silicide 420, a barrier layer 430, and a conductor 440. Details of fabricating the interconnection structure 400 are substantially the same as the method described in FIG. 2A to FIG. 2G. After the opening is formed in the ILD layer 370, the exposed portion of the pad 320 is textured by performing the physical removal process, such as a sputter process. Some of the reactive ions 412 for the sputter process, such as Ne, Ar, Kr, Xe, stay in the surface of the pad 320. The metal layer 410 is deposited in the opening of the ILD layer 370, and the bottom of the metal layer is reacted with the pad 320 and becomes silicide 420. The ions 412 remain the silicide 420. The metal layer 410 is present between the barrier layer 430 and the sidewall of the ILD layer 370 and is not present between the barrier layer 430 and the silicide 420. The barrier layer 430 is directly in contact with the silicide 420. The conductor 440 is formed filling the opening.

The surface of the epitaxy structure, such as the epitaxy structure and the semiconductor pad, is textured by performing a physical removal process. Some of the ions utilized in the physical removal process remain in the epitaxy structure. The epitaxy structure is reacted with the metal layer deposited thereon thereby forming a silicide therebetween. Since the surface of the epitaxy structure is textured, the contact area provided by the silicide is increased accordingly, thus the resistance of the interconnection structure is reduced.

According to some embodiments of the disclosure, a semiconductor device includes a semiconductor substrate, an epitaxy structure present in the semiconductor substrate, and a silicide present on the epitaxy structure. The epitaxy structure includes a textured surface, and a plurality of sputter residues are present between the silicide and the epitaxy structure.

According to some other embodiments of the disclosure, an interconnection structure includes a silicide present on an epitaxy structure, a conductor present on the silicide; and a barrier layer present between the conductor and the silicide. An interface between the epitaxy structure and the silicide is textured, and a plurality of sputter residues are present in the silicide.

According to some other embodiments of the disclosure, a method of fabricating an interconnection structure includes forming an opening in a dielectric layer to expose a portion of an epitaxy structure; performing a physical removal process to texture a surface of the epitaxy structure; forming a metal layer on the textured surface of the epitaxy structure; forming a barrier layer on the metal layer; and performing an annealing process, wherein the metal layer is reacted with the epitaxy structure thereby forming a silicide between the epitaxy structure and the barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnection structure comprising:
   an epitaxy structure, the epitaxy structure being a single continuous epitaxial layer, the single continuous epitaxial layer having a first faceted surface, a second faceted surface, and a third faceted surface extending from the first faceted surface to the second faceted surface, the first faceted surface having a roughened surface, the roughened surface having a plurality of recesses;
   a conductor on the roughened surface of the epitaxy structure; and
   a plurality of residues between the epitaxy structure and the conductor.

2. The interconnection structure of claim 1, wherein the residues comprise one or more types of material including: Argon (Ar), Neon (Ne), Krypton (Kr), and Xenon (Xe).

3. The interconnection structure of claim 1, further comprising:
   a silicide between the epitaxy structure and the conductor; and
   a barrier layer between the silicide and the conductor.

4. The interconnection structure of claim 3, further comprising:
   a metal layer, wherein the metal layer is present at a sidewall of the barrier layer and is not present between the silicide and the barrier layer.

5. The interconnection structure of claim 4, wherein the metal layer is made of titanium (Ti), cobalt (Co), nickel (Ni), platinum (Pt), or tungsten (W).

6. A method of fabricating an interconnection structure, the method comprising:
   forming an opening in a dielectric layer to expose a portion of an epitaxy structure;
   after forming the opening, causing an oxide layer to be formed over the epitaxy structure exposed in the opening, the opening being a single continuous opening;
   performing a dry etching process to remove portions of the oxide layer, the dry etching process forming a textured surface of the epitaxy structure in the opening, a remaining portion of the oxide layer remaining after performing the dry etching process;
   performing a wet etching process to remove the remaining portion of the oxide layer;
   after performing the wet etching process, forming a metal layer on the textured surface of the epitaxy structure;
   forming a barrier layer on the metal layer;
   performing an annealing process, wherein the metal layer is reacted with the epitaxy structure thereby forming a silicide between the epitaxy structure and the barrier layer; and
   filling the opening with a conductor.

7. The method of claim 6, wherein the annealing process is performed after the barrier layer is formed on the metal layer.

8. The method of claim 6, wherein the dry etching process forms the textured surface having a plurality of recesses.

9. The method of claim 6, wherein the dry etching process generates a plurality of residues on the epitaxy structure.

10. A method of fabricating a semiconductor device, the method comprising:
    forming an opening in a dielectric layer to expose a portion of an epitaxy structure, the epitaxy structure being a single continuous structure of an epitaxial material, wherein forming the opening uses a first etching process;

after forming the opening to expose a portion of the epitaxy structure, performing a dry etching process to form a textured surface of the epitaxy structure, wherein the dry etching process forms a plurality of recesses in the textured surface of the epitaxy structure, wherein the dry etching process is a different process step than the first etching process; and filling the opening with a conductor.

11. The method of claim 10, further comprising:

forming a metal layer on the textured surface of the epitaxy structure; and forming a barrier layer on the metal layer.

12. The method of claim 11, further comprising performing an annealing process such that the metal layer is reacted with the epitaxy structure to form a silicide between the epitaxy structure and the barrier layer.

13. The method of claim 12, wherein the annealing process is performed after the barrier layer is formed on the metal layer.

14. The method of claim 11, wherein forming the metal layer comprises forming the metal layer such that the metal layer is between a sidewall of the opening and the barrier layer.

15. The method of claim 10, wherein the dry etching process generates a plurality of residues on the epitaxy structure.

16. The method of claim 15, wherein the dry etching process is such that the plurality of the residues are between the conductor and the epitaxy structure.

17. The method of claim 15, wherein the dry etching process is such that the plurality of the residues include at least one of: Argon (Ar), Neon (Ne), Krypton (Kr), and Xenon (Xe).

18. The method of claim 10, further comprising forming a semiconductor pad by forming the epitaxy structure.

19. The method of claim 10, further comprising performing a chemical removal process after the dry etching process.

20. The method of claim 19, wherein the dry etching process removes a first portion of an oxide layer and the chemical removal process removes a second portion of the oxide layer.

* * * * *